(12) United States Patent
Huang et al.

(10) Patent No.: US 7,429,886 B2
(45) Date of Patent: Sep. 30, 2008

(54) POLY FUSE TRIMMING CIRCUIT

(75) Inventors: Jia-Jio Huang, Hsinchu (TW); Chien-Hui Chuang, Xindian (TW)

(73) Assignee: Faraday Technology Corp., Hsin-Chu (TW)

( * ) Notice: Subject to any disclaimer, the term of this patent is extended or adjusted under 35 U.S.C. 154(b) by 136 days.

(21) Appl. No.: 11/324,980

(22) Filed: Jan. 3, 2006

(65) Prior Publication Data

US 2007/0152733 A1    Jul. 5, 2007

(51) Int. Cl.
*H01H 37/76*  (2006.01)
*H01H 85/00*  (2006.01)

(52) U.S. Cl. ........................................ 327/525

(58) Field of Classification Search ................. None
See application file for complete search history.

(56) References Cited

U.S. PATENT DOCUMENTS 6,654,304 B1 * 11/2003 Huang ................. 365/225.7
2004/0207021 A1 * 10/2004 Russ et al. ............... 257/355

* cited by examiner

*Primary Examiner*—Tuan T. Lam
*Assistant Examiner*—Daniel Rojas
(74) *Attorney, Agent, or Firm*—Winston Hsu

(57) ABSTRACT

A poly fuse trimming circuit. The poly fuse trimming circuit comprises a poly fuse and a silicon controlled rectifier (SCR) device. The poly fuse is coupled between a first fixed potential and an output node. The SCR device is controlled by a trimming signal and has an anode coupled to the output node and a cathode coupled to a second fixed potential.

7 Claims, 3 Drawing Sheets

POLY FUSE TRIMMING CIRCUIT

BACKGROUND OF THE INVENTION

1. Field of the Invention

The invention relates to a poly fuse trimming circuit and, in particular, to a poly fuse trimming circuit with a silicon controlled rectifier (SCR) device.

2. Description of the Related Art

High precision resistors are critical for analog integrated circuit design. Process variation, however, is inevitable and thus poly fuse trimming technology is important.

FIG. 1 shows a schematic diagram of a conventional poly fuse trimming circuit. A poly fuse 101 is coupled between two pads 100 and 100'. When there is a voltage difference between the pads 100 and 100', current flows through the poly fuse 101. If the voltage difference is large enough, a large current breaks the poly fuse 101. In such a circuit, the pad area is large and therefore not cost effective. In addition, it is not easy to trim a plurality of poly fuses at the same time.

FIG. 2 shows another conventional poly fuse trimming circuit. The poly fuse trimming circuit comprises a poly fuse F1 and a transistor MNO. The poly fuse F1 is coupled between a power supply potential VDD and a node N. The transistor MNO is coupled between the node N and a ground GND. Two inverters U1 and U2 are connected in series to a gate of the transistor MNO. The inverter U1 receives a trimming signal TRIM. When the trimming signal TRIM turns on the transistor MNO via the inverters U1 and U2, current flows through the poly fuse F1. If the current is large enough, the poly fuse F1 is broken. In such a circuit, the transistor MNO needs to be large enough to sustain a large current such that the poly fuse Fl is broken before the transistor MNO is damaged. Thus, this circuit is not area (cost) effective.

BRIEF SUMMARY OF THE INVENTION

An embodiment of a poly fuse trimming circuit comprises a poly fuse and a silicon controlled rectifier (SCR) device. The poly fuse is coupled between a first fixed potential and an output node. The SCR device is controlled by a trimming signal and has an anode coupled to the output node and a cathode coupled to a second fixed potential.

The invention utilizes a SCR device to form a poly fuse trimming circuit. The SCR device can sustain large current and requires only a small area. In addition, simplified circuit design prevents an output node thereof from floating.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in limiting sense. The scope of the invention is best determined by reference to the appended claims.

Figure 1:
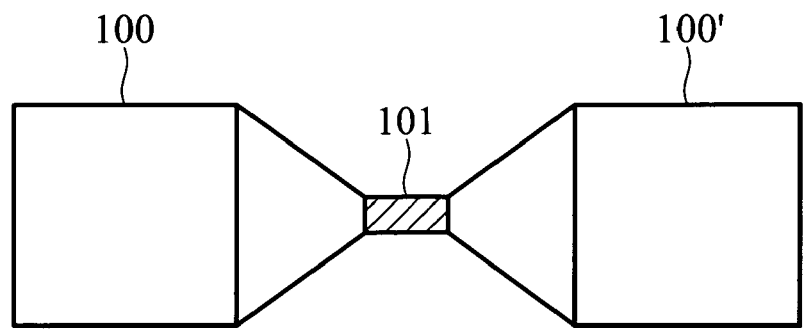
FIG. 1 is a schematic diagram of a conventional poly fuse trimming circuit.
Figure 2:
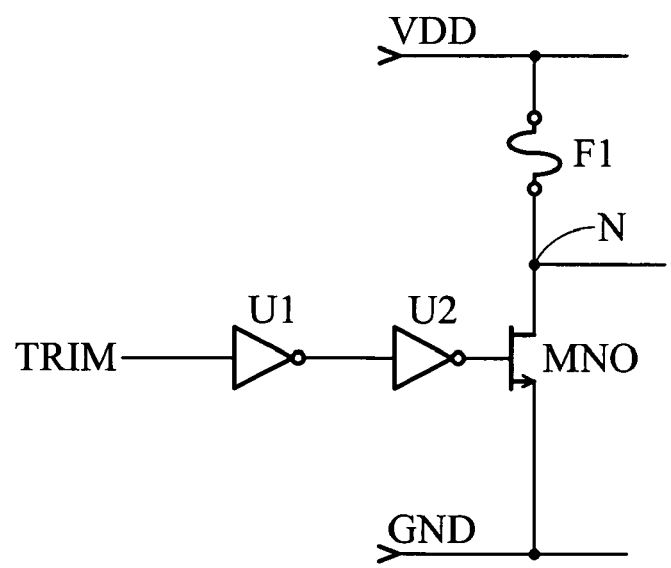
FIG. 2 shows another conventional poly fuse trimming circuit.
Figure 3A:
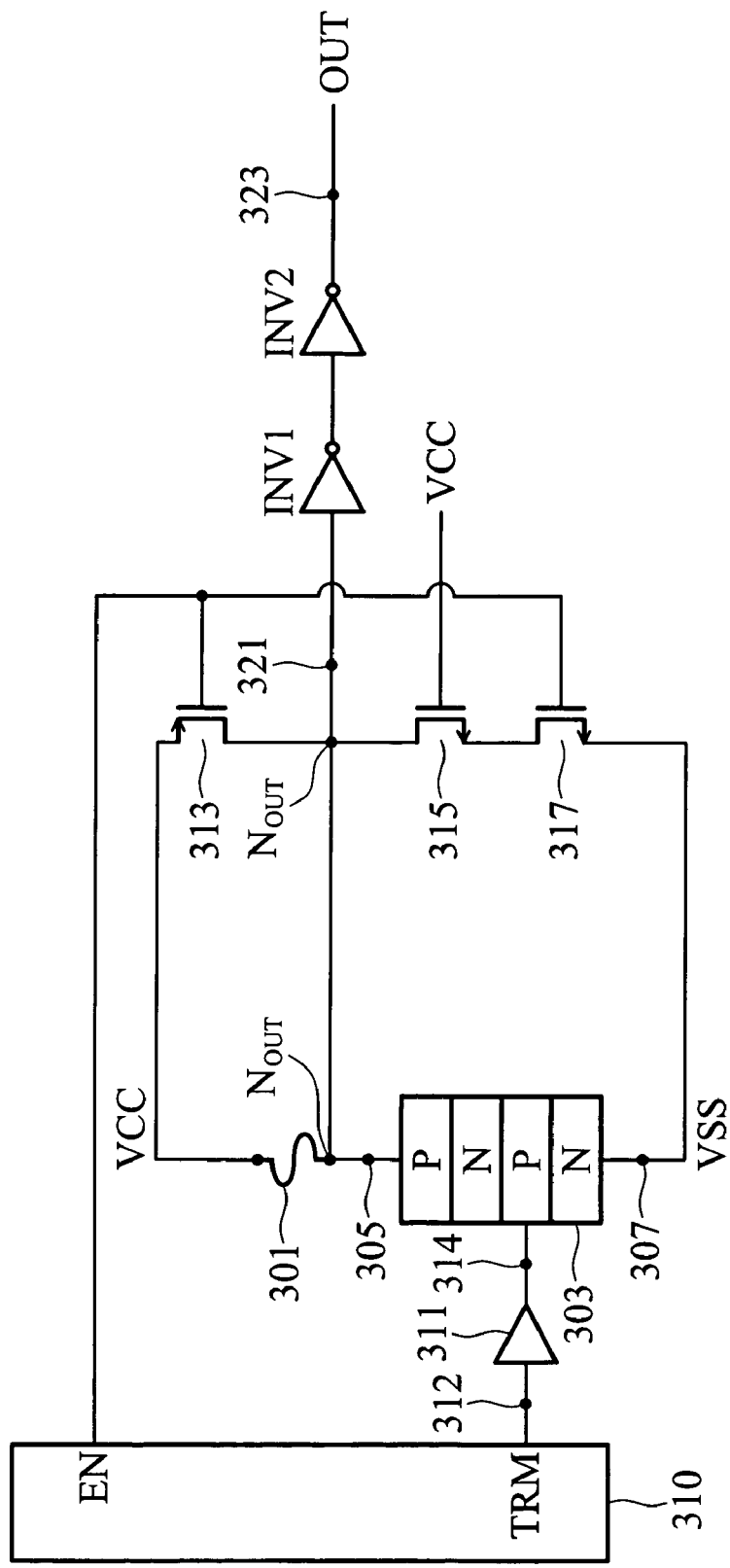
FIG. 3A is a schematic diagram of a poly fuse trimming circuit according to an embodiment of the invention.

FIG. 3A is a schematic diagram of a poly fuse trimming circuit according to an embodiment of the invention. The poly fuse trimming circuit 300 comprises a poly fuse 301 and a silicon controlled rectifier (SCR) device 303. The poly fuse 301 is coupled between a first fixed potential VCC and an output node $N_{OUT}$. The SCR device 303 is controlled by a trimming signal TRM. If the SCR device 303 is turned on by the trimming signal TRM, the SCR device 303 can tolerate a large current without damage. The SCR device 303 has an anode 305 coupled to the output node $N_{out}$ and a cathode 307 coupled to a second fixed potential VSS. More specifically, the first and second fixed potentials are respectively a power supply potential and a ground. Moreover, the trimming signal TRM is generated by a signal generator 310. Preferably, a buffer 311 is coupled between the signal generator 310 and the SCR device 303. The buffer has an input terminal 312 receiving the trimming signal TRM and an output terminal 314 coupled to the SCR device 303.

Figure 3B:
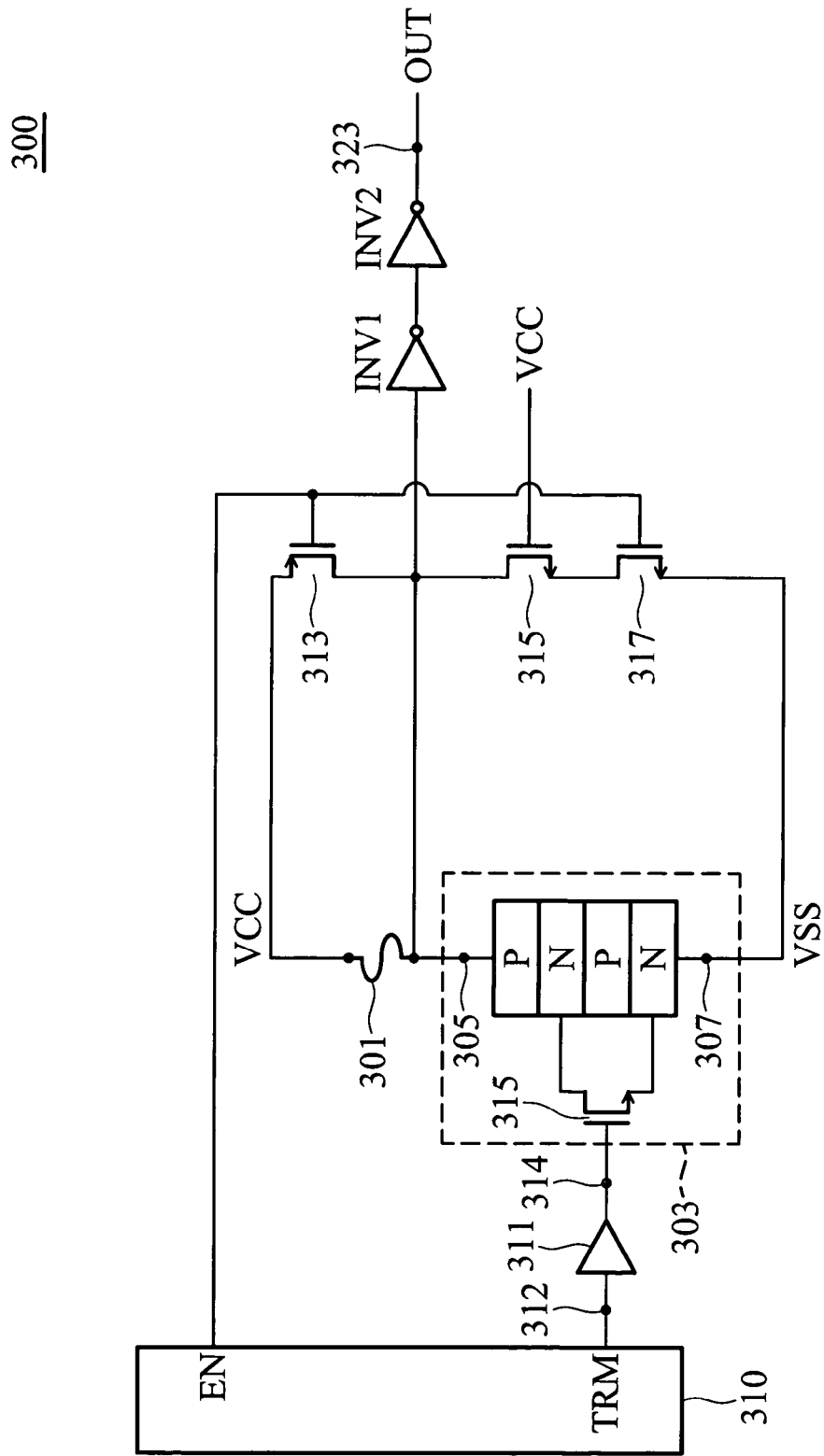
FIG. 3B shows a variation of the poly fuse trimming circuit in FIG. 3A.

Additionally, the poly fuse trimming circuit 300 further comprises a pull up device 313 and two pull down devices 315 and 317. The pull up device 313 is coupled between the first fixed potential VCC and the output node $N_{out}$. The pull down devices 315 and 317 are connected in series between the output node $N_{out}$ and the second fixed potential VSS. The pull down device 315 is kept at a conducting state. The pull up device 313 and the pull down device 317 are controlled by an enable signal EN. The enable signal EN can be generated by the signal generator 310 or another signal generator. More specifically, the pull up device 313 is a PMOS transistor and the pull down devices 315 and 317 are NMOS transistors. A gate of the NMOS transistor 315 is connected to the first fixed potential VCC and the PMOS transistors to the enable signal EN. Moreover, the poly fuse trimming circuit 300 further comprises two inverters INV1 and INV2 connected in series between an output terminal OUT and the output node $N_{out}$. An input terminal 321 of the inverter INV1 is coupled to the output node $N_{OUT}$ and an output terminal 323 of the inverter INV2 is coupled to the output terminal OUT. Preferably, the SCR device 303 in the poly fuse trimming circuit 300 is a low voltage SCR (LVSCR), as shown in FIG. 3B. The LVSCR has a gate 315 controlled by the trimming signal TRM.

Operation of the poly fuse trimming circuits in FIGS. 3A and 3B is disclosed as follows. In a trimming mode, the trimming signal TRM goes high and triggers the SCR device or the LVSCR to conduct large current such that the poly fuse is broken. Meanwhile, the enable signal EN also goes high such that the pull up device 313 is turned off and the pull down device 317 is turned on. As a result, the output node $N_{OUT}$ is pulled low and so is the output terminal. In a non-trimming mode, the first fixed potential VCC is ready and the trimming signal keeps low. Thus, the poly fuse 301 is not broken. Additionally, the enable signal EN is at a high state such that the pull up device 313 is turned off and the pull down device 317 is turned on. Since resistance of the poly fuse 301 is lower than the pull down devices 315 and 317, the output node $N_{OUT}$ is pulled high and so is the output terminal OUT. In a power down mode, the enable signal EN is at a low state. As a result, there is no static current and the output node $N_{OUT}$ and the output terminal OUT are kept at a high state.

The invention utilizes a SCR device to form a poly fuse trimming circuit. The SCR device can sustain large current and requires only a small area. In addition, simplified circuit design prevents an output node thereof from floating.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A poly fuse trimming circuit, comprising:
   a poly fuse coupled between a first fixed potential and an output node;
   a silicon controlled rectifier (SCR) device controlled by a trimming signal and having an anode coupled to the output node and a cathode coupled to a second fixed potential;
   a pull up device, coupled between the first fixed potential and the output node; and
   first and second pull down devices connected in series between the output node and the second fixed potential; wherein the first pull down device is kept at a conducting state and the pull up device and the second pull down device are controlled by an enable signal.

2. The poly fuse trimming circuit as claimed in claim 1, wherein the SCR device is a low voltage silicon controlled rectifier (LVSCR) having a gate controlled by the trimming signal.

3. The poly fuse trimming circuit as claimed in claim 1, further comprising a buffer having an input terminal receiving the trimming signal and an output terminal coupled to the SCR device.

4. The poly fuse trimming circuit as claimed in claim 1, wherein the pull up device is a PMOS transistor and the pull down devices are NMOS transistors.

5. The poly fuse trimming circuit as claimed in claim 1, further comprising a signal generator generating the trimming signal and the enable signal.

6. The poly fuse trimming circuit as claimed in claim 1, further comprising an inverter coupled between an output terminal and the output node.

7. The poly fuse trimming circuit as claimed in claim 1, wherein the first and second fixed potentials are respectively a power supply potential and a ground.

* * * * *